United States Patent

Huang et al.

[11] Patent Number: 6,166,427
[45] Date of Patent: *Dec. 26, 2000

[54] INTEGRATION OF LOW-K SIOF AS INTER-LAYER DIELECTRIC FOR AL-GAPFILL APPLICATION

[75] Inventors: Richard J. Huang, Cupertino; John A. Iacoponi, San Jose, both of Calif.

[73] Assignee: Advanced Micro Devices, Inc., Sunnyvale, Calif.

[*] Notice: This patent issued on a continued prosecution application filed under 37 CFR 1.53(d), and is subject to the twenty year patent term provisions of 35 U.S.C. 154(a)(2).
This patent is subject to a terminal disclaimer.

[21] Appl. No.: 09/231,649

[22] Filed: Jan. 15, 1998

[51] Int. Cl.[7] .......................... H01L 23/58; H01L 21/31; H01L 21/469

[52] U.S. Cl. .................. 257/635; 257/636; 257/638; 438/784; 438/788

[58] Field of Search .................... 257/635, 636, 257/638; 438/784, 788, 789

[56] References Cited

U.S. PATENT DOCUMENTS

| | | | |
|---|---|---|---|
| 5,703,404 | 12/1997 | Matsura | 257/758 |
| 5,753,975 | 5/1998 | Matsuno | 257/751 |
| 5,789,315 | 8/1998 | Besser et al. | 438/624 |
| 5,872,065 | 2/1999 | Sivaramakrishnan | 438/784 |
| 5,913,140 | 6/1999 | Roche et al. | 438/624 |
| 5,994,778 | 11/1999 | Huang et al. | 257/758 |

*Primary Examiner*—Olik Chaudhuri
*Assistant Examiner*—Shrinivas H. Rao
*Attorney, Agent, or Firm*—Foley & Lardner

[57] ABSTRACT

A method for producing a dielectric layer in a semiconductor product includes two steps. The first step is forming a fluorinated layer (e.g. SiOF or fluorosilicate glass ("FSG")) which includes a material formed in part with fluorine. The second step is forming a fill layer (e.g. $SiO_2$) above the fluorinated layer. The fill layer is substantially free of materials formed in part with fluorine. A top surface of the fill layer can be planarized. Surface treatments and oxide caps can be applied to the planarized surface to form fluorine barriers if part of the fluorinated layer is exposed to higher layers. Such a method, and a semiconductor device or integrated circuit manufactured according to the method, allow the dielectric constant of an inter-layer dielectric ("ILD") to be lowered while also minimizing the complexity and expense of the manufacturing process.

10 Claims, 4 Drawing Sheets

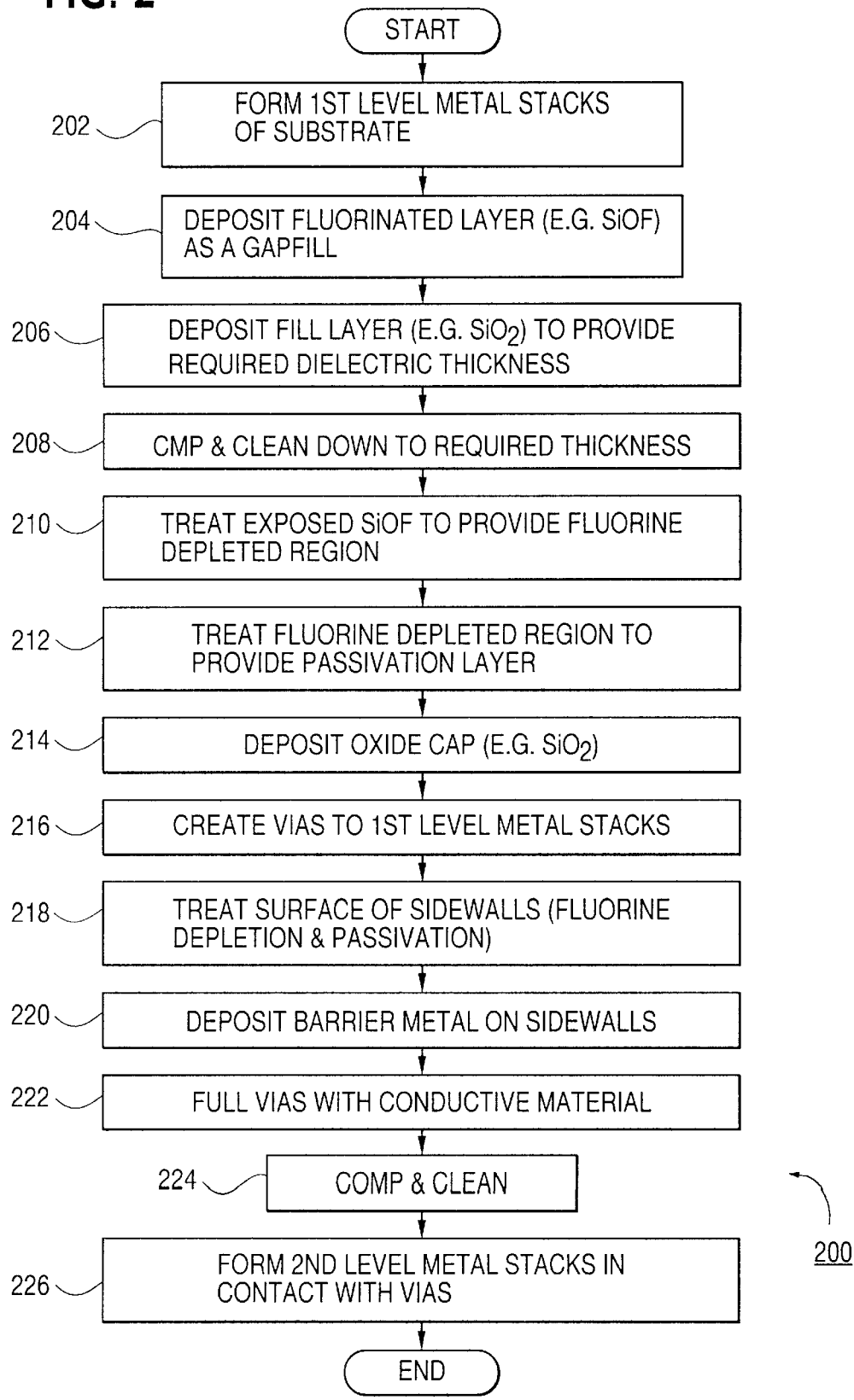

INTEGRATION OF LOW-K SIOF AS INTER-LAYER DIELECTRIC FOR AL-GAPFILL APPLICATION

BACKGROUND OF THE INVENTION

1. Field of the Invention

The present invention relates generally to the integration of fluorinated materials with a low dielectric constant (low-K) into an inter-layer dielectric ("ILD"). The present invention relates more particularly to integrating fluorosilicate glass ("FSG") or SiOF as a gapfill layer in an ILD, to thereby obtain the benefit of a low-K to improve device performance.

2. Description of the Related Art

U.S. patent application Ser. No. 09/157,240, filed on Sep. 18, 1998, deals with related technology. That application is entitled "Surface Treatment of Low-K SiOF to Prevent Metal Interaction" by Richard J. Huang and is assigned to Advanced Micro Devices.

U.S. patent application Ser. No. 09/203,572 filed Dec. 2, 1998 deals with related technology. That application is entitled "Integration of Low-K SiOF as Inter-layer Dielectric" by Richard J. Huang and is assigned to Advanced Micro Devices. The attorney docket number for that application is 39153/132.

Fluorinated $SiO_2$, typically provided by way of plasma enhanced chemical vapor deposition ("PECVD") or by way of high density plasma ("HDP"), can be used to lower the dielectric constant of $SiO_2$ from, for example, 4.0 to 3.5–3.8. The lowering of the dielectric constant is advantageous for a number of reasons, including the reduction of the capacitance of a semiconductor device, which results in an improved performance of the semiconductor device.

However, fluorine in $SiO_2$ will react with physical vapor deposition ("PVD") or chemical vapor deposition ("CVD") barrier metals, such as Ti, TiN, Ta, TaN, etc., which are subsequently deposited on the surface of the fluorinated $SiO_2$. This reaction between fluorine and the barrier metals will cause delamination of the barrier metals on both the flat SiOF surfaces, as well as inside the vias. Both of these occurrences are disadvantageous.

SUMMARY OF THE INVENTION

It is an object of the present invention to provide FSG as an ILD, whereby the possibility of fluorine leakage to neighboring layers is lessened by treating the FSG with a plasma such that a fluorine-depleted region and a nitrided region are obtained.

It is another object of the present invention to provide an oxide cap on top of nitrided region to provide an additional barrier to the fluorine atoms from moving into adjacent conductive (e.g., metal) layers.

It is yet another object of the present invention to provide FSG as an inter-metal dielectric layer using in-situ deposition.

It is yet another object of the present invention to provide a fluorinated layer which fills the gaps between metal stacks in an integrated circuit ("IC"), thereby achieving the benefits associated with using fluorine, and to provide for an additional layer that may be deposited on top of the gapfill layer.

Briefly, in accordance with one aspect of the invention, there is provided a method for producing a dielectric layer in a semiconductor product. The method includes two steps. The first step is forming a fluorinated layer which includes a material formed in part with fluorine. The second step is forming a fill layer above the fluorinated layer. The fill layer is substantially free of materials formed in part with fluorine. The dielectric layer includes both the fluorinated layer and the fill layer.

Briefly, in accordance with another aspect of the invention, there is provided a semiconductor device which includes a fluorinated layer and a fill layer. The fill layer is situated above the fluorinated layer. The fluorinated layer includes a material formed in part with fluorine. The fill layer is substantially free of materials formed in part with fluorine.

Briefly, in accordance with another aspect of the present invention, there is provided a method for producing a dielectric layer in a semiconductor product. The method includes two steps. The first step is forming a fluorinated layer which includes a material formed in part with fluorine. The second step is depleting the fluorine from a surface of the fluorinated layer.

Briefly, in accordance with another aspect of the invention, there is provided a semiconductor device which includes an integrated circuit. The integrated circuit has at least a first layer, a second layer, and a dielectric layer. The dielectric layer is positioned between the first layer and the second layer. The dielectric layer includes a material formed in part with fluorine. The dielectric layer also has a first region at one edge which is depleted of fluorine to a predetermined depth.

BRIEF DESCRIPTION OF THE DRAWINGS

The accompanying drawings, which are incorporated in and constitute part of the specification, illustrate a presently preferred embodiment of the invention, with like reference numerals indicating corresponding parts throughout, and, together with the general description given above and the detailed description of the preferred embodiment given below, serve to explain the principles of the invention.

FIG. 2 is a flow diagram showing the processes or steps involved in the formation of an inter-layer dielectric layer according to a preferred embodiment of the invention.

DETAILED DESCRIPTION OF A PREFERRED EMBODIMENT

The present invention will be described in detail below in terms of the preferred embodiment, with references to the accompanying figures. Although a specific embodiment of the invention is disclosed, it will be understood by those having skill in the art that changes can be made to this specific embodiment without departing from the spirit and scope of the invention. The scope of the invention is not to be restricted, therefore, to the specific embodiment, and it is intended that the appended claims cover any and all such applications, modifications, and embodiments within the scope of the present invention.

U.S. patent application Ser. No. 09/157,240, filed on Sep. 18, 1998, deals with related technology, and is incorporated in its entirety herein by reference. That co-pending application is entitled "Surface Treatment of Low-K SiOF to Prevent Metal Interaction" by Richard J. Huang and is assigned to Advanced Micro Devices (hereinafter referred to as the "240 Application").

U.S. patent application Ser. No. 09/203,572, filed Dec. 2, 1998 dealing with related technology and has an attorney docket number of 39153/132. That co-pending application is entitled "Integration of Low-K SiOF as Inter-layer Dielectric" by Richard J. Huang and is assigned to Advanced Micro Devices, and is incorporated in its entirety herein by reference (hereinafter referred to as the "ILD Application").

Both the 240 Application and the ILD Application disclose methods and apparatuses for applying fluorinated layers as dielectrics in a semiconductor device. Also disclosed is a process for depleting the fluorine from a top portion of a fluorinated layer, passivating a top portion of a fluorinated layer, and applying an oxide cap. Additionally disclosed is a similar process for treating the sidewalls of vias which extend through a fluorinated layer. The preferred embodiment utilizes each of the above described features, as well as others.

FIGS. 1A–1H show the steps involved in forming a semiconductor device with two layers of metal connected by vias and separated with a low-K inter-layer dielectric ("ILD") comprising a fluorinated layer. This embodiment utilizes a fluorinated layer as a gapfill. In that way, the benefits of using fluorine are partially attained, such as reducing the overall dielectric constant. At the same time, this process is relatively easy to manufacture, as compared for instance to using two fluorinated layers. The preferred embodiment can be thought of as an entry-level low-K approach.

Figure 1A:
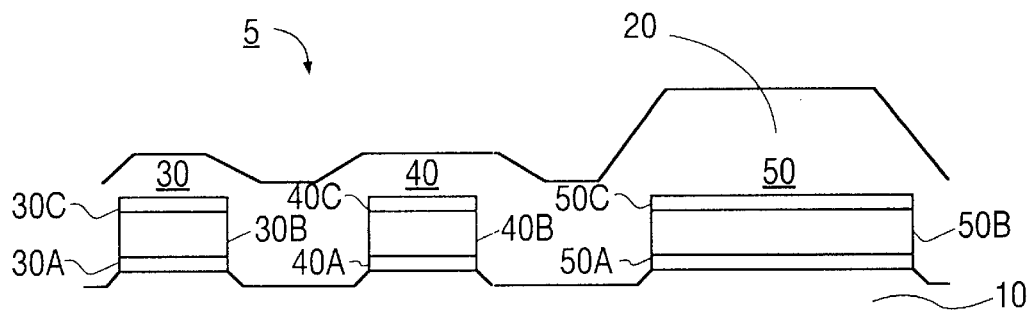
FIGS. 1A–1H are cross-sectional diagrams of a semiconductor device illustrating the processes or steps involved in the formation of an inter-layer dielectric layer according to a preferred embodiment of the invention.

In FIG. 1A, there is shown a semiconductor device 5 with three metal stacks 30, 40, 50 on top of a semiconductor substrate 10 such as a silicon substrate.

Each metal stack 30, 40, 50 may contain, for example, liner layers 30A, 30C, 40A, 40C, 50A, and 50C that may comprise Ti or TiN, and a conducting metal layer 30B, 40B, 50B such as aluminum. Liner layers 30C, 40C, and 50C may also serve as anti-reflective coating ("ARC") layers, which absorb light and allow for easier patterning of the stacks. Aluminum alloys, containing one half percent copper or one percent copper, are commonly used for the conducting material. Aluminum alloys with one half percent copper and one percent silicon, once widely used, are less common now. Other configurations and materials are, of course, possible and within the scope of the present invention.

On top of the metal stacks 30, 40, 50 there is deposited, by any of a number of methods known in the art, including without limitation high density plasma ("HDP") and plasma enhanced chemical vapor deposition ("PECVD"), a fluorinated layer 20. The fluorinated layer comprises a material formed in part with fluorine, such as SiOF or fluorosilicate glass ("FSG"), and preferably has a dielectric constant in a range of from 3.5 to 3.8, inclusive. In the preferred embodiment, SiOF is used for the fluorinated layer 20 and the deposition is performed in-situ by an HDP process.

In alternate embodiments, any fluorine containing film may be used. Other materials include, without limitation, Teflon materials containing fluorine produced by W. L. Gore, and Parylene AF4. Particular parameters may need to be changed, however, as those skilled in the art will recognize. For instance, the Teflon materials are better suited to a spin-on deposition process wherein the wafer is spun and the surface is coated with the material. Additionally, the Parylene AF4 material is not suitable for a gapfill application, and therefore a gapfill layer would have to be deposited before applying the Parylene AF4.

In an HDP process, the wider metal stack 50 will result in a thicker deposition than that corresponding to the narrower metal stacks 30, 40, as shown in FIG. 1A. In the preferred embodiment, the deposition thickness on metal stack 50 is between 0.8 and 1.0 microns, inclusive. This is also the preferred thickness for the ILD. However, as can be seen, another layer will have to be added to bring the thickness of the entire ILD up to this range.

Figure 1B:
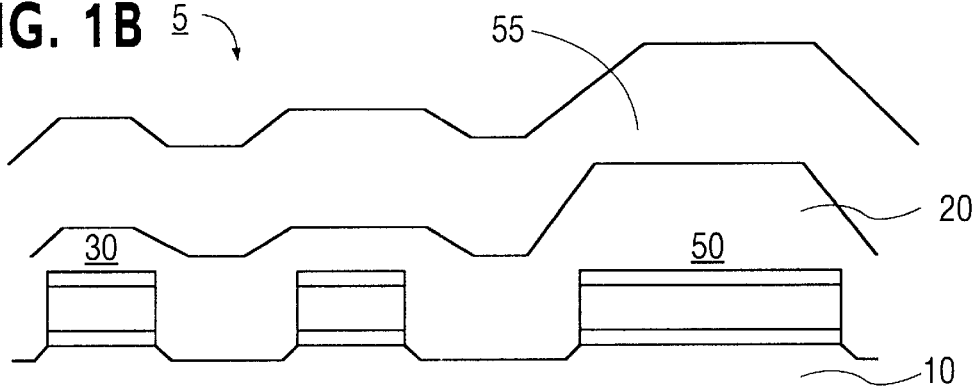

In FIG. 1B, there is shown an additional layer 55 added to the SiOF layer 20, which brings the thickness of the entire ILD up to the desired range. The ILD thus comprises both the fluorinated layer 20 and the fill layer 55. This fill layer 55 need not contain fluorine or any material which is formed, in part, with fluorine, and is preferably substantially free of materials formed in part with fluorine. In the preferred embodiment, the fill layer 55 is $SiO_2$ and also serves as an oxide cap.

The fill layer 55 can be fabricated using either a $SiH_4$ or TEOS based process. Generally, the fill layer 55 is a silicon-rich oxide with a reflective index ("RI") greater than 1.47. The fill layer 55 can be deposited in-situ using PECVD and preferably has a maximum thickness in the range of from 1.5 to 2.0 microns, inclusive, which brings the maximum thickness of the ILD to roughly 2.5 to 3.0 microns. The incorporated references give further details on the deposition of the fill layer 55.

In alternate embodiments, other dielectric materials such as HSQ can be used as the fill layer 55. As with the fluorinated layer 20, alternate materials may require different deposition processes, as those who are skilled in the art will recognize. HSQ, for example, is deposited with a spin-on process.

Figure 1C:
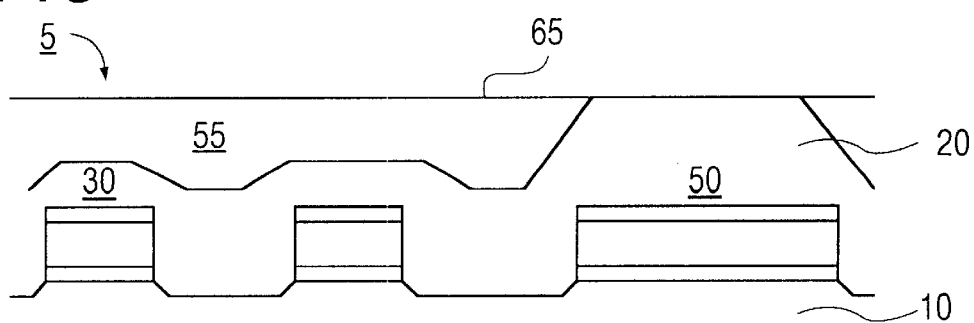

In FIG. 1C there is shown the semiconductor device 5 after a planarizing step. The planarizing step preferably entails performing a chemical mechanical polishing ("CMP") and clean process, but other methods, such as an etch back, may also be used. The top surface 65 of the semiconductor device 5 is now substantially planar. The planarizing step is used, in part, to reduce the thickness to that required for the ILD.

In the preferred embodiment, the HDP deposition of the SiOF layer 20 creates a layer 20 with a thickness greater than that required for the ILD. Therefore, the planarizing step also exposes at least part of the SiOF layer 20, as indicated in FIG. 1C.

In alternate embodiments, however, this need not occur, and the fluorinated layer 20 may remain completely covered by the fill layer 55. This may occur, for instance with a thin fluorinated layer 20, or with an embodiment which uses an additional gapfill layer before the fluorinated layer 20. In either of these examples, the fill layer 55 may be left covering the entire fluorinated layer 20 after the planarizing step.

Figure 1D:
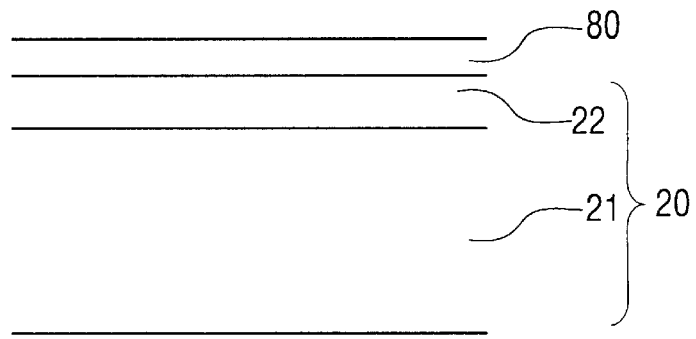
Figure 1E:
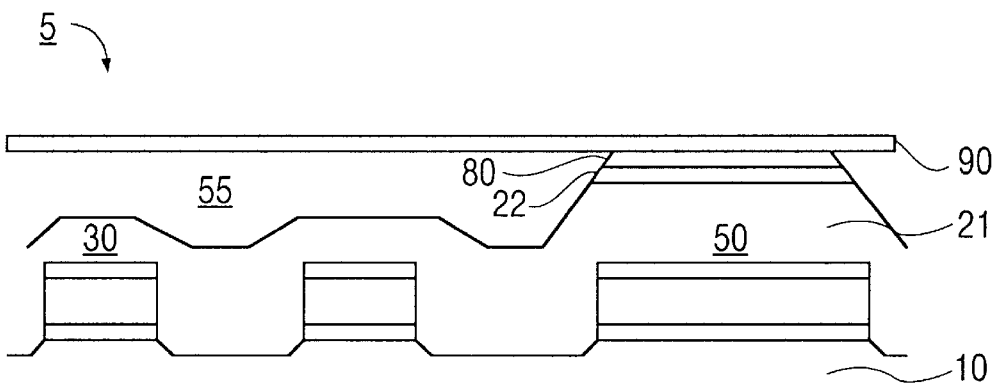

In the preferred embodiment, the exposed portion, if any, of the fluorinated layer 20 is then treated to minimize the interaction of the fluorine with the layers which will be deposited on top of the ILD. FIGS. 1D and 1E illustrate the end result of these treatments, although the figures are not drawn to scale. As more fully described in the incorporated references, the first treatment is a surface treatment to create a fluorine depleted region 22 which is substantially free of fluorine. The rest of the fluorinated layer 20 can be designated a non-fluorine depleted region 21. In the preferred embodiment, the entire planarized surface 65, and not merely the exposed portion of the fluorinated layer 20, is treated. However, because the fill layer 55 has no fluorine, the treatment does not materially affect that portion of the surface 65.

In the above step, the objective is to completely eliminate the fluorine in the skin layer. This skin layer is typically around 100 angstroms, and can be up to roughly 200 angstroms or more. However, due to the background noise in the measuring instruments, it can only be verified that the fluorine has been reduced to roughly 1–2%. Higher values are acceptable and merely increase the risk of fluorine interaction with higher layers. However, further barriers, which are described below and in the incorporated references, can be utilized to reduce this risk.

The fluorine depleted region 22 is then preferably passivated. In the preferred embodiment, the region 22 is nitrided to form a passivation layer 80 which only penetrates a portion of the fluorine depleted region 22. In the preferred embodiment, the nitrogen bonds with the oxygen. In alternate embodiments, however, other passivation processes are possible.

In FIG. 1D, the passivation layer 80 is shown as being separate from the fluorinated layer 20, while the fluorine depleted region 21 is shown as still being a part of the fluorinated layer 20. This designation is not critical, however. Additionally, alternate embodiments may use different parameters, including depth, in forming either the fluorine depleted region 21 and/or the passivation layer 80, or may omit one or both of these treatments.

In FIG. 1E, there is shown the semiconductor device. 5 with an oxide cap 90 applied. The oxide cap 90 preferably has a thickness in the range of from 500 to 2500 angstroms, inclusive, with the thickness being based, in part, on the quality of the oxide cap 90, as discussed in the ILD Application. Preferably, the oxide cap 90 is $SiO_2$, deposited in-situ using PECVD, and can be either $SiH_4$ or TEOS based. Performing the treatment steps and the oxide cap step in-situ simplifies production and maximizes throughput.

Figure 1F:
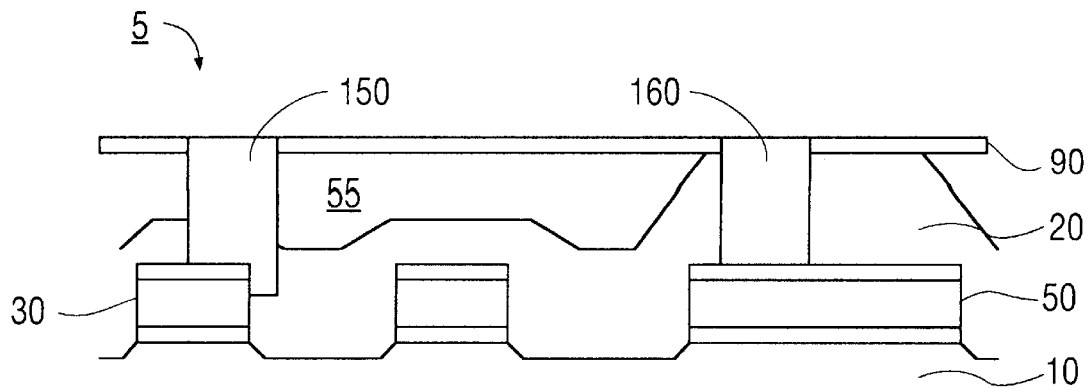
Figure 1G:
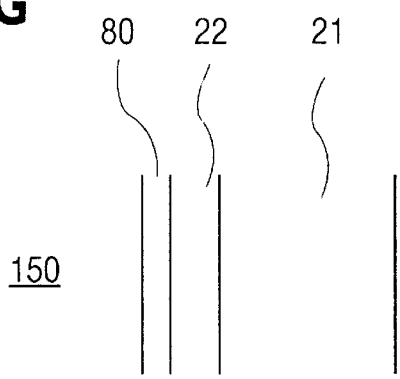
Figure 1H:
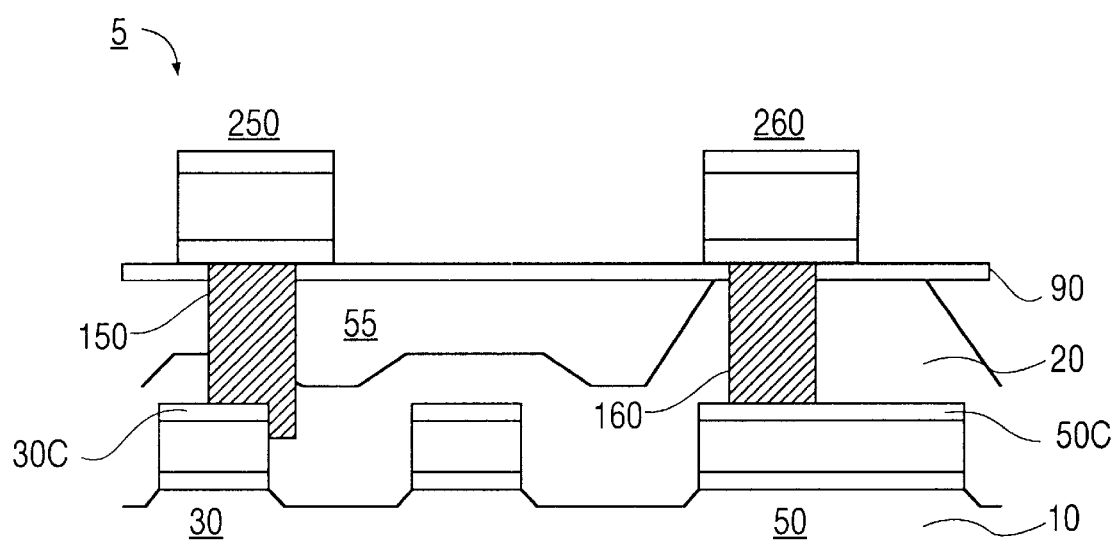

FIGS. 1F–1H show several additional steps in the preparation of the semiconductor device 5, all of which are described in detail in the incorporated references. Briefly, FIG. 1F shows the formation of two vias 150, 160. Via 150 is formed through the oxide cap 90, the fill layer 55, and the fluorinated layer 20. Via 160 is formed through the oxide cap 90 and the fluorinated layer 20. The sidewalls in each of the vias 150, 160 are preferably treated to form a fluorine depleted region 22 and a passivation layer 80 as shown in FIG. 1G and described above with respect to FIG. 1D.

As shown in FIG. 1F, via 160 is aligned so that the entire width of the via 160 is on top of the metal stack 50. Misalignment may occur, however, as shown with via 150 and metal stack 30. This misalignment can reduce the contact surface and thereby increase the via resistance. However, by using the surface on the side of the metal stack, as shown with respect to metal stack 30, the contact surface can be increased.

After the treatments, a barrier metal is then deposited on the sidewalls and a conductive material is deposited within the vias 150, 160. By way of example, and not limitation, the barrier metal may be Ti or TiN, and the conducting material may be tungsten. After the deposition of the conducting material into the vias 150, 160, a CMP and clean step is then preferably performed for planarization, and metal stacks 250, 260 are formed as shown in FIG. 1H.

Metal stacks 250, 260 can be formed in a variety of methods known in the art. The incorporated references more fully discuss the preferred method of depositing a conducting layer and then using a mask and etch process to form the metal stacks 250, 260. The conducting layer in metal stack 250 is electrically connected to metal stack 30 by virtue of the conductive material in via 150, and the conducting layer in metal stack 260 is electrically connected to metal stack 50 by virtue of the conductive material in via 160. In the preferred embodiment, the liner layers 30C, 50C are also conductive. These and additional features are further described in the incorporated references. It should also be clear that significant variations of the preferred embodiment are possible and fall within the scope of the invention.

In FIG. 2 there is shown a flow diagram showing the processes or steps involved in the formation of an ILD layer. The steps shown in the diagram parallel the discussion above related to FIGS 1A–H. The flow in FIG. 2 has thirteen steps which will be broken into several subtasks for explanatory purposes. These subtasks include forming the ILD, treating the surface, forming the vias, and forming the top level of conductors.

Forming the ILD generally comprises forming the first level metal stacks on a semiconductor substrate 202, depositing the fluorinated layer 204, depositing the fill layer 206, and planarizing the surface 208.

Treating the surface of the ILD generally comprises treating the exposed portion, if any, of the fluorinated layer to create a fluorine depleted region 210, treating the fluorine depleted region to create a passivation layer 212, and depositing an oxide cap 214.

Forming the vias generally comprises creating one or more vias down to the first level metal stacks 216, treating the surface of the sidewalls of the vias to create a fluorine depleted region and a passivation layer 218, depositing a barrier metal on the treated sidewalls 220, depositing a conductive material in the vias 222, and planarizing the surface 224.

Forming the top level of conductors 226 comprises, for example, depositing a conducting layer, as well as any liner layers, and performing the mask and etch processes.

What is claimed is:

1. A semiconductor device comprising:
   a fluorinated layer comprising a material formed in part with fluorine;
   a fill layer disposed above at least a portion of the fluorinated layer, wherein the fill layer is free of materials formed in part with fluorine,
   wherein another portion of the fluorinated layer is not covered with the fill layer, and the another portion comprises a fluorine depleted region which includes fluorine of an amount more than zero percent and less than two percent.

2. The semiconductor device of claim 1, wherein:
   the fluorinated layer comprises SiOF;
   the fluorinated layer has a dielectric constant in a range of from 3.5 to 3.8, inclusive; and
   the fill layer comprises $SiO_2$.

3. The semiconductor device of claim 1, wherein:
   the fluorinated layer has a maximum thickness in the range of from 0.8 to 1.0 microns, inclusive; and
   the fill layer has a maximum thickness in the range of from 1.5 to 2.0 microns, inclusive.

4. The semiconductor device of claim 1, wherein a top portion of the fluorine depleted region comprises a passivation layer, wherein the passivation layer has a thickness which is less than the thickness of the fluorine depleted region.

5. The semiconductor device of claim 1, further comprising an oxide cap which is disposed above both the fill layer and the fluorinated layer.

6. The semiconductor device of claim 5, wherein the oxide cap has a thickness in the range of from 500 to 2500 angstroms, inclusive.

7. A semiconductor device comprising:

a semiconductor substrate;

a first metal stack disposed above the semiconductor substrate;

a fluorinated layer comprising a material formed in part with fluorine, wherein the fluorinated layer is disposed above the first metal stack;

a fill layer disposed above at least a portion of the fluorinated layer, wherein:

the fill layer is free of materials formed in part with fluorine;

a top surface of the fill layer is planarized;

the planarized top surface of the fill layer does not cover another portion of the fluorinated layer;

a top part of the another portion of the fluorinated layer comprises a fluorine depleted region which includes fluorine of an amount more than zero percent and less than two percent; and a top portion of the fluorine depleted region comprises a passivation layer, wherein the passivation layer has a thickness which is less than the thickness of the fluorine depleted region;

an oxide cap disposed above both the fill layer and the fluorinated layer;

a conducting layer disposed above the oxide cap; and a via, which runs from the conducting layer to the first metal stack, for electrically connecting the conducting layer to the first metal stack, wherein a top part of all remaining portions of the fluorinated layer does not comprise the fluorine depleted region, and wherein the all remaining portions of the fluorinated layer are covered by the planarized top surface of the fill layer.

8. The semiconductor device of claim 7:

wherein the first metal stack is aligned under at least a portion of the another portion of the fluorinated layer, such that the via runs through the oxide cap and the fluorinated layer and does not contact the fill layer;

further comprising a second metal stack disposed above the semiconductor substrate and disposed below both the fluorinated layer and the fill layer; and further comprising a second via, for electrically connecting the conducting layer to the second metal stack, wherein the second via runs from the conducting layer through the oxide cap and both the fill layer and the fluorinated layer to the second metal stack.

9. The semiconductor device of claim 8, further comprising:

a third metal stack disposed above the via, such that the via electrically connects the third metal stack to the first metal stack, and wherein the third metal stack comprises part of the conducting layer; and a fourth metal stack disposed above the second via, such that the second via electrically connects the fourth metal stack to the second metal stack, and wherein the fourth metal stack comprises part of the conducting layer.

10. A semiconductor device comprising:

a semiconductor substrate;

a first metal stack disposed above the semiconductor substrate, the first metal stack having a first width;

a second metal stack disposed above the semiconductor substrate, the second metal stack having a second width greater than the first width;

a fluorinated layer comprising a material formed in part with fluorine, wherein the fluorinated layer is disposed above the first metal stack and the second metal stack;

a fill layer disposed above at least a first portion of the fluorinated layer that is disposed above the first metal stack, wherein the fill layer is free of materials formed in part with fluorine, wherein a top surface of the fill layer is planarized, wherein the planarized top surface of the fill layer does not cover a second portion of the fluorinated layer that is disposed above the second metal stack, wherein a top part of second portion of the fluorinated layer comprises a fluorine depleted region which includes fluorine in an amount of greater than zero percent and less than two percent, and wherein a top portion of the fluorine depleted region comprises a passivation layer, the passivation layer having a thickness which is less than the thickness of the fluorine depleted region.

* * * * *

UNITED STATES PATENT AND TRADEMARK OFFICE
CERTIFICATE OF CORRECTION

PATENT NO. : 6,166,427  
DATED : December 26, 2000  
INVENTOR(S) : Richard J. Huang. et al.

Page 1 of 1

It is certified that error appears in the above-identified patent and that said Letters Patent is hereby corrected as shown below:

<u>Title page,</u>
Item [22] Filed: January 15, delete "1998" and insert -- 1999 --.

Signed and Sealed this

Twenty-seventh Day of November, 2001

Attest:

*Nicholas P. Godici*

NICHOLAS P. GODICI
*Attesting Officer*  *Acting Director of the United States Patent and Trademark Office*